(12) United States Patent
Chen et al.

(10) Patent No.: US 9,812,432 B2
(45) Date of Patent: Nov. 7, 2017

(54) LED CHIP PACKAGE

(71) Applicant: LEXTAR ELECTRONICS CORPORATION, Hsinchu (TW)

(72) Inventors: Yi-Jyun Chen, Chiayi County (TW); Chih-Hao Lin, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/162,538

(22) Filed: May 23, 2016

(65) Prior Publication Data

US 2017/0084586 A1 Mar. 23, 2017

(30) Foreign Application Priority Data

Sep. 21, 2015 (TW) .............................. 104131094 A (51) Int. Cl.
| | |
|---|---|
| *H01L 25/075* | (2006.01) |
| *H01L 33/08* | (2010.01) |
| *H01L 33/62* | (2010.01) |
| *H01L 33/60* | (2010.01) |
| *H01L 33/50* | (2010.01) |
| *H01L 27/15* | (2006.01) |

(52) U.S. Cl.
CPC ...... *H01L 25/0753* (2013.01); *H01L 25/0756* (2013.01); *H01L 27/15* (2013.01); *H01L 33/08* (2013.01); *H01L 33/502* (2013.01); *H01L 33/60* (2013.01); *H01L 33/62* (2013.01)

(58) Field of Classification Search
CPC ... H01L 25/0753; H01L 27/15; H01L 33/641; H01L 33/48–33/6484
See application file for complete search history.

(56) References Cited

U.S. PATENT DOCUMENTS

| | | | |
|---|---|---|---|
| 4,845,405 A | 7/1989 | Yamane et al. | |
| 2006/0180818 A1* | 8/2006 | Nagai | F21K 9/00 257/89 |
| 2006/0181860 A1* | 8/2006 | Larson | H01L 23/3677 361/720 |
| 2009/0289273 A1* | 11/2009 | Tsai | H01L 33/385 257/98 |

FOREIGN PATENT DOCUMENTS

| | | |
|---|---|---|
| EP | 1649514 | 4/2006 |
| EP | 2562815 | 2/2013 |
| EP | 2843705 | 3/2015 |
| JP | 2002043635 | 2/2002 |
| JP | 2004179641 | 6/2004 |
| TW | 201034266 | 9/2010 |

(Continued)

OTHER PUBLICATIONS

Taiwan Patent Office, Office Action, Patent Application Serial No. 104131094, dated Jun. 27, 2016, Taiwan.

(Continued)

*Primary Examiner* — Daniel Shook (57) ABSTRACT

An LED chip package includes a substrate having a metal terminal (gold finger structure). A LED chip set is composed of a plurality of LED chips formed in one piece, and has a plurality of light-emitting areas which are separated from each other. The LED chip set is disposed on the substrate and electrically connected to the metal terminal.

15 Claims, 6 Drawing Sheets

(56) References Cited

FOREIGN PATENT DOCUMENTS

| TW | 201123539 | 7/2011 |
| TW | 201241942 | 10/2012 |
| TW | 201310720 | 3/2013 |
| TW | 201312809 | 3/2013 |
| TW | 201349596 | 12/2013 |
| WO | WO 2014/142448 | 9/2014 |

OTHER PUBLICATIONS

European Patent Office, Office Action, Patent Application Serial No. 16170605.6, dated Aug. 4, 2016, Europe.

* cited by examiner

LED CHIP PACKAGE

CROSS REFERENCE TO RELATED APPLICATIONS

This application is entitled "LED chip package", which claims priority of Taiwan Patent Application No. LED chip set 104131904, filed on Sep. 21, 2015, the entirety of which is incorporated by reference herein.

BACKGROUND OF THE INVENTION

Field of the Invention

The present invention relates to chip package, and in particular to an LED (light-emitting diode) chip package.

Description of the Related Art

A light-emitting diode is formed by forming an active layer over a substrate and depositing different conductive and semi-conductive layers over the substrate. The recombination radiation of electron and hole may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation such as light. The aforementioned electromagnetic radiation may lie in the visible region or the non-visible region. Materials with different band gaps may be used to form light-emitting diodes of different colors. In addition, electromagnetic radiation in the non-visible region may be transferred to visible light through phosphorous lenses.

Since the light-emitting diode industry has recently tended towards mass production, any increase in the yield of manufacturing light-emitting diodes will reduce costs and result in huge economic benefits. Therefore, a simple method for manufacturing light-emitting diode chip packages that can effectively increase the yield without adding too many manufacturing steps or too much cost is needed.

BRIEF SUMMARY OF THE INVENTION

According to some embodiments of the disclosure, an LED chip package is provided. The LED chip package includes a substrate having a metal terminal, and an LED chip set formed by a plurality of LED chips in one piece. The LED chip set has a plurality of light-emitting areas separated from each other, and the LED chip set is disposed on the substrate and electrically connected to the metal terminal.

According to some embodiments of the disclosure, an LED chip package is provided. The LED chip package includes a substrate having a metal terminal, and an LED chip set formed by wafer level chip scale packaging, wherein the LED chip set has a plurality of light-emitting areas separated from each other, and the LED chip set is disposed on the substrate and electrically connected to the metal terminal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The light-emitting diode chip package of the present disclosure and the method for manufacturing this light-emitting diode chip package are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not directly contact the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

The embodiments of the present disclosure utilize a light-emitting diode chip set (LED chip set) formed by a plurality of light-emitting diode chips (LED chips) in one piece to simplify the manufacturing steps and reduce the cost of the LED chip packages, and the LED chip set also has a plurality of light-emitting areas which are separated from each other. This LED chip set is also referred to as a wafer level chip scale packaging LED chip set.

FIGS. 1A to 1F are cross-sectional or side view representations of various stages of forming an LED chip package 100 in accordance with some embodiments of the present disclosure.

Figure 1A:
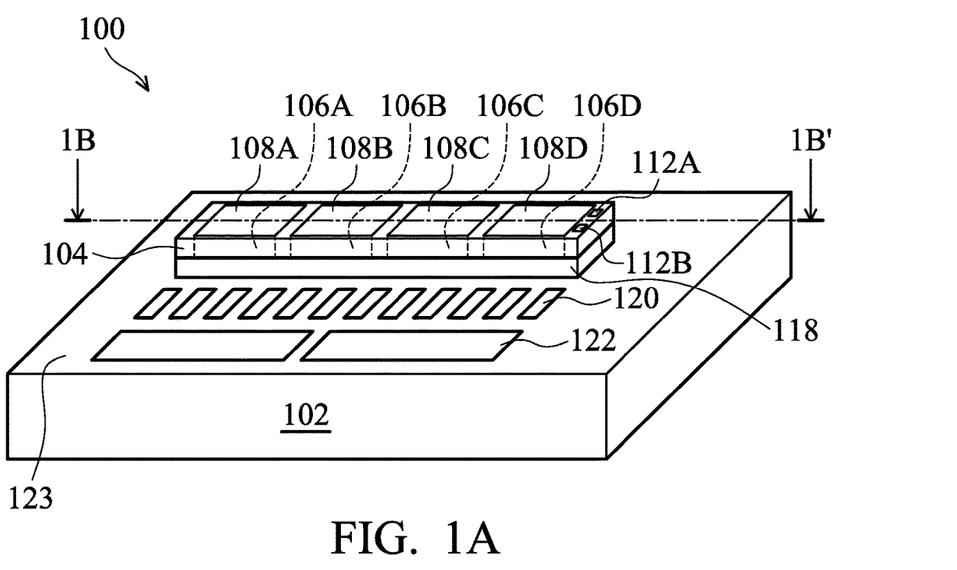
FIG. 1A shows a side view of a light-emitting diode chip package according to an embodiment of the disclosure.

At first, referring to FIG. 1A, FIG. 1A is a cross-sectional representation of one stage for forming an LED chip package 100 in accordance with some embodiments of the present disclosure. The LED chip package 100 includes a substrate 102, and an LED chip set 104 is disposed over the substrate 102. A metal terminal 120 (or referred as a gold finger structure) is disposed on the substrate 102 and an electrical connecting area 122 that is electrically connected to the metal terminal 120 is also disposed on the substrate 102. In addition, a portion of the substrate 102 which does not belong to the metal terminal 120 and the electrical connecting area 122 is an insulating area 123. The substrate 102 may include a ceramic substrate, metal substrate or another applicable heat-sink substrate. The metal terminal 120 includes a plurality of copper pads. A gold layer is usually plated on the copper pads for improving the conductive ability of the metal terminal 120. The electrical connecting area 122 is fixed on the substrate 102, and the LED chip set 104 is electrically connected to other outside conductive elements (not shown) through the electrical connecting area 122. The material of the insulating area 123 includes polyimide, butylcyclobutene (BCB), parylene, polynaphthalene, fluorocarbons, acrylate or a combination thereof. In addition to providing insulation, the insulating area 123 also protects the wires and other elements (not shown) disposed in the substrate 102.

Figure 1B:
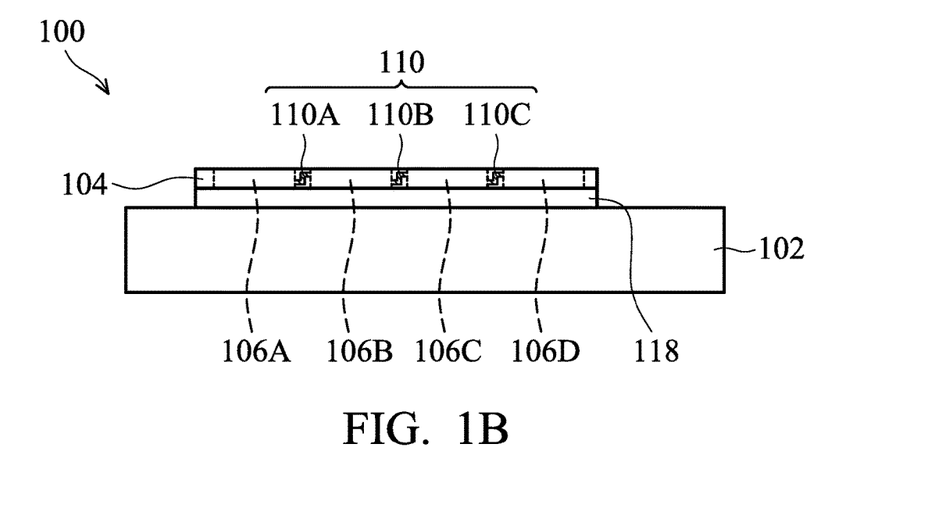
FIG. 1B shows a cross-sectional view of the light-emitting diode chip package along line BB' of FIG. 1A.

Referring to FIG. 1B, FIG. 1B shows a cross-sectional view along line BB' of the LED chip package 100 of FIG. 1A. As shown in FIG. 1B, the LED chip set 104 is formed by a plurality of light-emitting diode chips, such as four LED chips 106A, 106B, 106C and 106D formed in one piece. Alternately, the LED chip set 104 is also referred to as a wafer level chip scale packaging LED chip set 104. Although the figures only show four light-emitting diode chips, the embodiments of the present disclosure are not intended to be limiting. The LED chip set 104 may also be formed by two or more light-emitting diode chips. These LED chips 106A, 106B, 106C and 106D may individually include, but are not limited to, an ultraviolet LED chip, a blue LED chip, a green LED chip, a red LED chip, or any other suitable LED chip, and respectively correspond to light-emitting areas 108A, 108B, 108C and 108D which are separated from each other. The LED chip set 104 is electrically connected to the metal terminal 120 by wires (not shown) disposed in the substrate 102. In some embodiments, the wavelength of radiation of the light-emitting diode chips is in a range between 260 nm and 630 nm.

The wafer level chip scale packaging LED chip set 104 formed by the plurality of LED chips 106A, 106B, 106C and 106D is different from the independent light-emitting diode chips formed by conventional chip packaging technology. In particular, the conventional chip packaging technology would perform a cutting step first to separate each of the LED chips formed over the wafer, and then each of the independent LED chips is packaged individually. Unlike conventional chip packaging technology, the LED chip set 104 formed by the plurality of LED chips 106A, 106B, 106C and 106D (also referred to as the wafer level chip scale packaging LED chip set 104) is packaged at the wafer level stage. For example, the plurality of the LED chips in the wafer level chip scale packaging LED chip set 104 are electrically connected to each other. Subsequently, a cutting step is performed to singulate the LED chip set 104 formed by the plurality of LED chips 106A, 106B, 106C and 106D. The semiconductor substrate (such as a portion of a wafer) carrying the plurality of LED chips 106A, 106B, 106C and 106D, and used to connect this plurality of LED chips 106A, 106B, 106C and 106D, is not cut.

In particular, referring to FIG. 1B, using the wafer level chip scale packaging LED chip set 104, which is formed by four LED chips 106A, 106B, 106C and 106D in one piece, shown in FIG. 1B as an example, the four LED chips 106A, 106B, 106C and 106D are electrically connected to each other by a conductive wire structure 110 in a semiconductor substrate 118 of the wafer at the wafer design and wafer manufacture stages. As shown in FIG. 1B, the conductive wire structure 110 has three portions 118A, 118B and 118C which are used to connect two adjacent LED chips of the LED chips 106A, 106B, 106C and 106D. For example, the portion 118A of the conductive wire structure 110 connects the LED chips 106A and 106B. The conductive wire structure 110 may include, but is not limited to, an interconnection structure in a semiconductor substrate 118. Subsequently, a cutting step is performed to singulate the LED chip set 104 formed by these four LED chips 106A, 106B, 106C and 106D. The semiconductor substrate 118 between the plurality of LED chips 106A, 106B, 106C and 106D, which is used to connect this plurality of LED chips 106A, 106B, 106C and 106D, is not cut.

The semiconductor substrate 118 may include, but is not limited to, a silicon substrate. Alternatively, the semiconductor substrate 118 may also include an element semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy or a combination thereof. In addition, the semiconductor substrate 118 may also include a semiconductor-on-insulator.

As shown in FIGS. 1A-1B, the plurality of LED chips 106A, 106B, 106C and 106D in the LED chip set 104 are closely arranged with high accuracy. Therefore, the gap between two adjacent light-emitting areas (e.g. light-emitting areas 108A and 108B) is very small. In some embodiments, the gap between these light-emitting areas 108A, 108B, 108C and 108D is larger than 0 and smaller than 50 μm. In this embodiment, the manufacturing method of the LED chip package 100 is not same as the conventional method which arranges a plurality of individually LED chips which are separated from each other. Therefore, the cost of the LED chip package of the disclosure is reduced significantly. In addition, the plurality of LED chips 106A, 106B, 106C and 106D with close arrangement may avoid from spot phenomenon. Furthermore, due to the process limitation of die bonding of conventional multiple LED chip package, the gap between die bonding areas is in a range between about 50 μm and 100 μm. Compared to the conventional multiple LED chip package, the gap between the light-emitting area of the LED chip set of the embodiments of the present disclosure can make a breakthrough beyond the limit of conventional processes, such that the gap between the light-emitting areas 108A, 108B, 108C and 108D is smaller than 50 nm. Accordingly, the emission intensity of the LED chip package 100 is enhanced.

In addition, in some embodiments as shown in FIGS. 1A-1B, the plurality of light-emitting areas 108A, 108B, 108C and 108D of the LED chip package 100 are juxtaposed or placed side by side.

Furthermore, as shown in FIG. 1A, the LED chip set 104 has a first electrode 112A and a second electrode 112B. The LED chip set 104 is electrically connected to the metal terminal 120 on the substrate 102 by the first electrode 112A and the second electrode 112B. The first electrode 112A and the second electrode 112B are disposed in the same side of the LED chip set 104. In some embodiments, the first electrode 112A and the second electrode 112B are disposed in the same light-emitting area (such as the light-emitting area 108D). In some embodiments, the first electrode 112A and the second electrode 112B are disposed in different light-emitting areas.

Figure 1C:
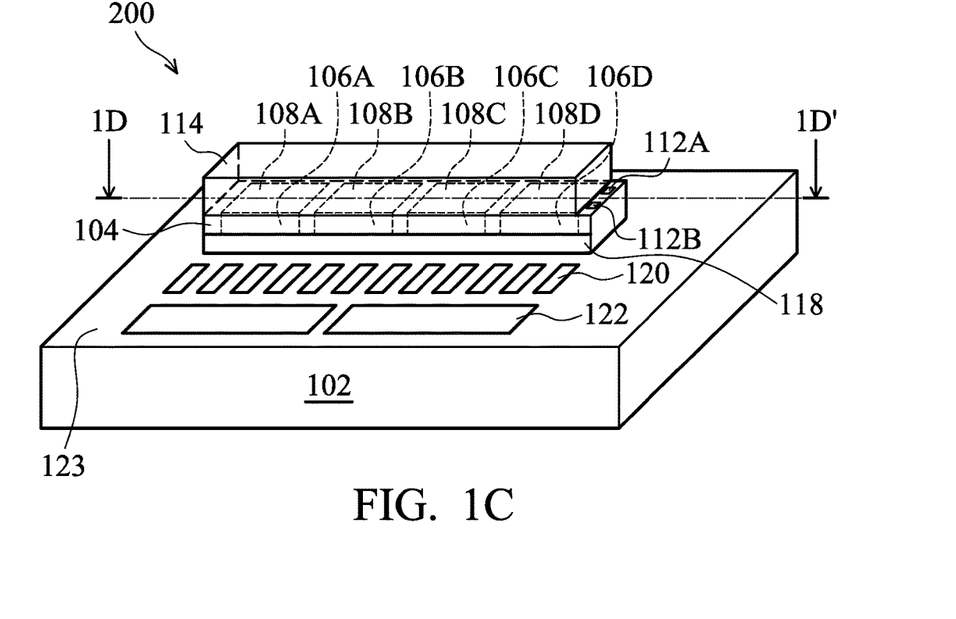
FIG. 1C shows a side view of the light-emitting diode chip package according to another embodiment of the disclosure.
Figure 1D:
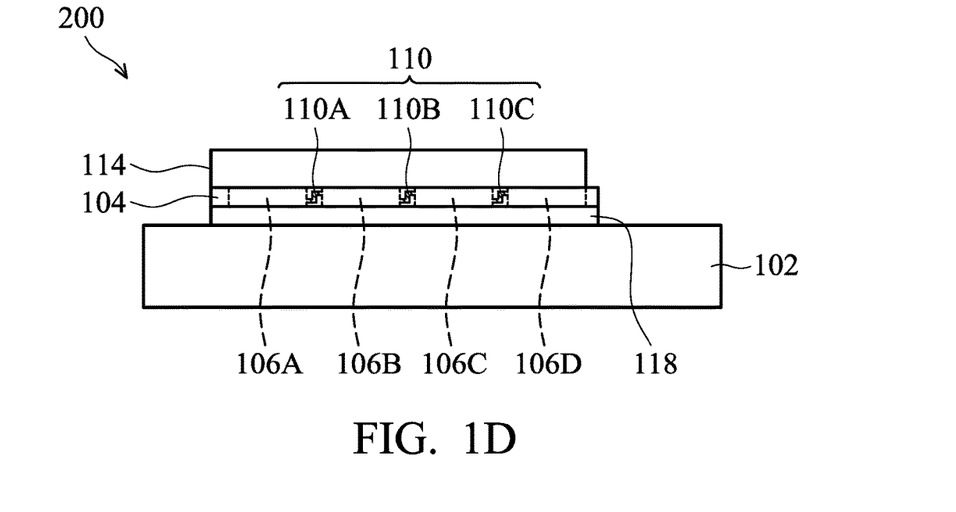
FIG. 1D shows a cross-sectional view of the light-emitting diode chip package along line DD' of FIG. 1C.

Next, referring to FIG. 1C-1D, FIG. 1C is a cross-sectional view of a stage of forming a LED chip package 200 at various manufacturing stages in accordance with some embodiments of the present disclosure, and FIG. 1D shows a cross-sectional view along line DD' of the LED chip package 200 of FIG. 1C. As shown in FIGS. 1C-1D, the LED chip package 200 may further includes a fluorescent sheet 114 disposed over the LED chip set 104.

In some embodiments of the present disclosure, the fluorescent sheet 114 may include, but is not limited to, a fluorescent powder-blended ceramic sheet (referred to as a ceramic fluorescent sheet). The ceramic fluorescent sheet may be formed by sintering the fluorescent powder and ceramic powder at high temperature. The examples of ceramic powders include silicon oxide, aluminum oxide or any other suitable materials. The examples of fluorescent powders include yttrium aluminium garnet ($Y_3Al_5O_{12}$, YAG), lutetium aluminium garnet ($Lu_3Al_5O_{12}$, LuAG), silicate, nitride or any other suitable fluorescent powder. The fluorescent powders of the fluorescent sheet 114 may convert the light emitted by the light-emitting diode chip into white light. In other embodiments, the fluorescent sheet 114 may include, but is not limited to, a glass sheet or a silica gel blended with the fluorescent powder.

Every conventional light-emitting diode chip needs a corresponding fluorescent sheet to dispose on respectively, and every fluorescent sheet has to be cut into a particular shape to expose the bonding region underneath of the light-emitting diode chip. Furthermore, the conventional light-emitting diode chip is electrically connected to other conductive elements by the wire disposed on the bonding region. In the embodiment as shown in FIGS. 1C-1D, since only the right side of the LED chip set 104 on which the first electrode 112A and the second electrode 112B are disposed need to be exposed by the fluorescent sheet 114, the fluorescent sheet 114 does not have to be cut into a particular shape to expose the bonding region underneath of each of the light-emitting diode chips. Thus, by utilizing the LED chip set 104 of the present disclosure, the complicated cutting fluorescent sheet process may be simplified so that the manufacturing steps of the LED chip set 104 may be simplified, and the cost of manufacturing may be reduced compared to the conventional light-emitting diode chip package.

Figure 1E:
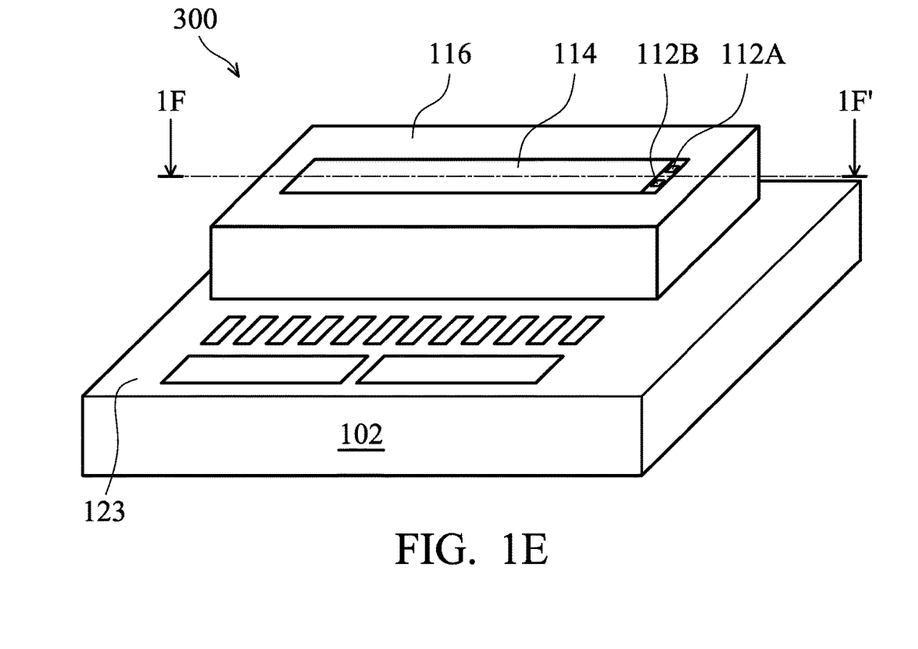
FIG. 1E shows a side view of the light-emitting diode chip package according to further an embodiment of the disclosure.
Figure 1F:
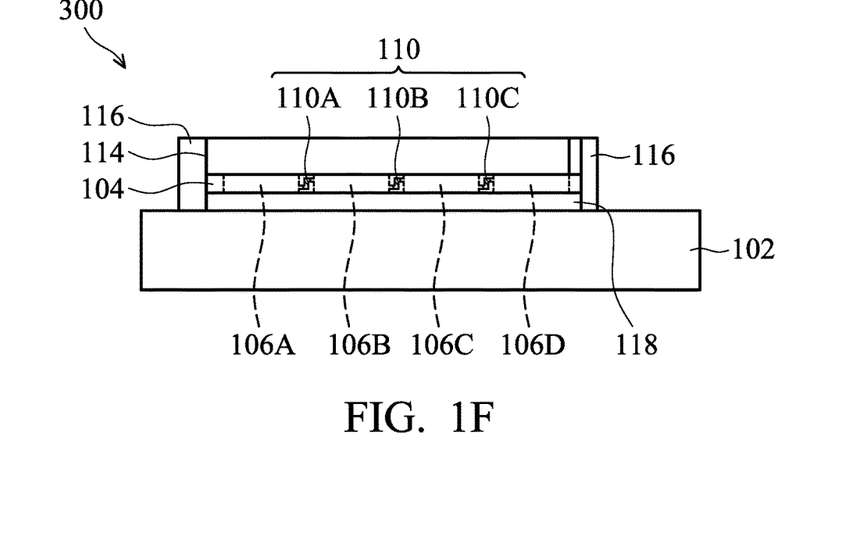
FIG. 1F shows a cross-sectional view of the light-emitting diode chip package along line FF' of FIG. 1E.

Next, referring to FIGS. 1E-1F, FIG. 1E is a cross-sectional view of a stage of forming a LED chip package 300 at various manufacturing stages in accordance with some embodiments of the present disclosure, and FIG. 1F shows a cross-sectional view along line EE' of the LED chip package 300 of FIG. 1E. As shown in FIG. 1E, a reflective element 116 is formed on the substrate 102 and is disposed to surround the LED chip set 104. The reflective element 116 is used to shield the region of the LED chip set 104 that is not designed for light emission (namely the sidewall of the LED chip set 104 in FIG. 1E), and the top surface of the fluorescent sheet 114 is exposed by the reflective element 116. In some embodiments, the top surface of the fluorescent sheet 114 is coplanar with the top surface of the reflective element 116. In other some embodiments, the top surface of the fluorescent sheet 114 is not coplanar with the top surface of the reflective element 116.

It should to be note that the LED chip set 104 of the present disclosure is directly disposed on the substrate 102 which has the metal terminal 120. In the conventional light-emitting diode chip package, the light-emitting diode chip needs to be disposed on the carrier substrate at first. Then the light-emitting diode chip is electrically connected to the carrier substrate by a wire, and finally the carrier substrate is disposed on a substrate which has a metal terminal. Compared to the conventional light-emitting diode chip package, the LED chip package 100 of the present disclosure doesn't need an additional carrier substrate to load the LED chip set 104, and it also doesn't need additional wires to electrically connect the LED chip set 104 to a carrier substrate. Therefore, it can save material and reduce costs, and achieve less thermal resistance for the LED chip package 100. In some embodiments, the LED chip set 104 is electrically connected to the first electrode 112A and the second electrode 112B by a conductive layer (not shown) disposed in or on the substrate 102.

To dispose the LED chip set 104 directly on the substrate 102 which has the metal terminal 120, the substrate 102 needs to be specially designed to achieve the purpose mentioned above.

Figure 2A:
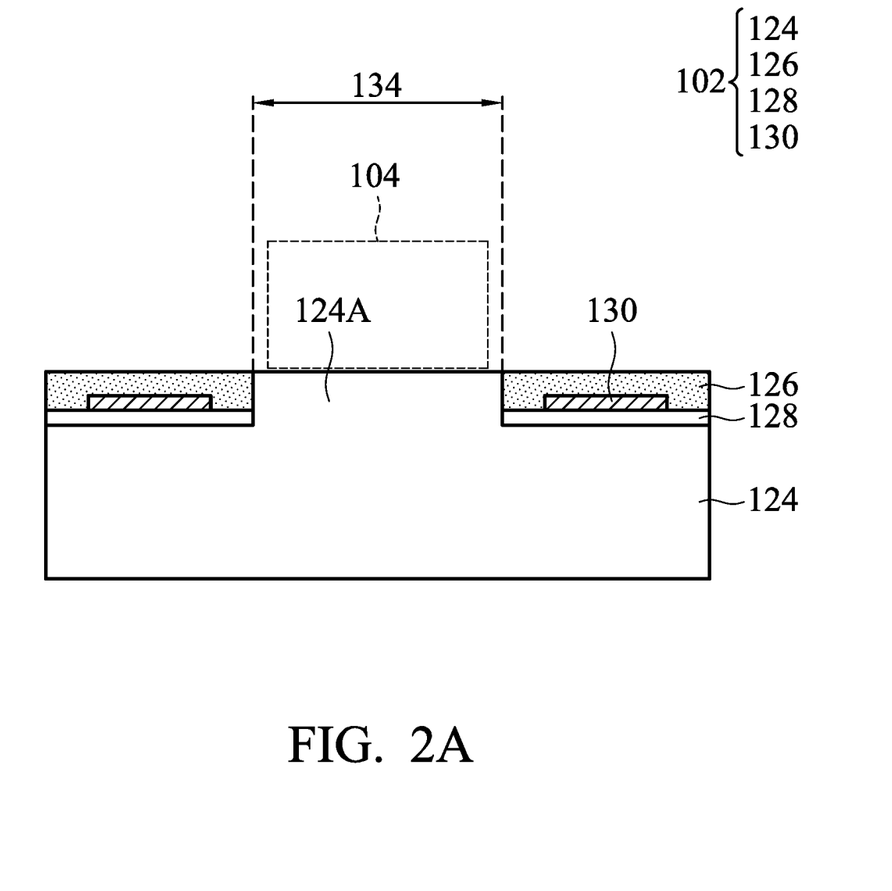
FIG. 2A shows a cross-sectional view of a substrate of an LED chip package according to an embodiment of the disclosure.
Figure 2B:
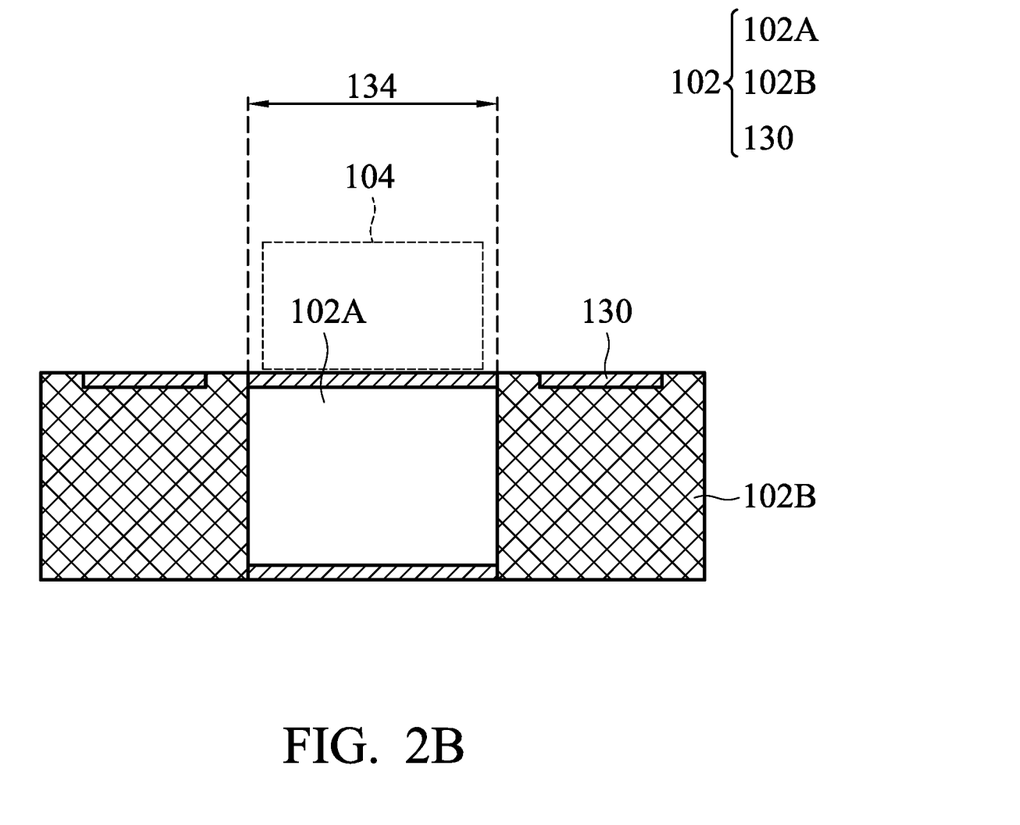
FIG. 2B shows a cross-sectional view of a substrate of an LED chip package according to another embodiment of the disclosure.
Figure 2C:
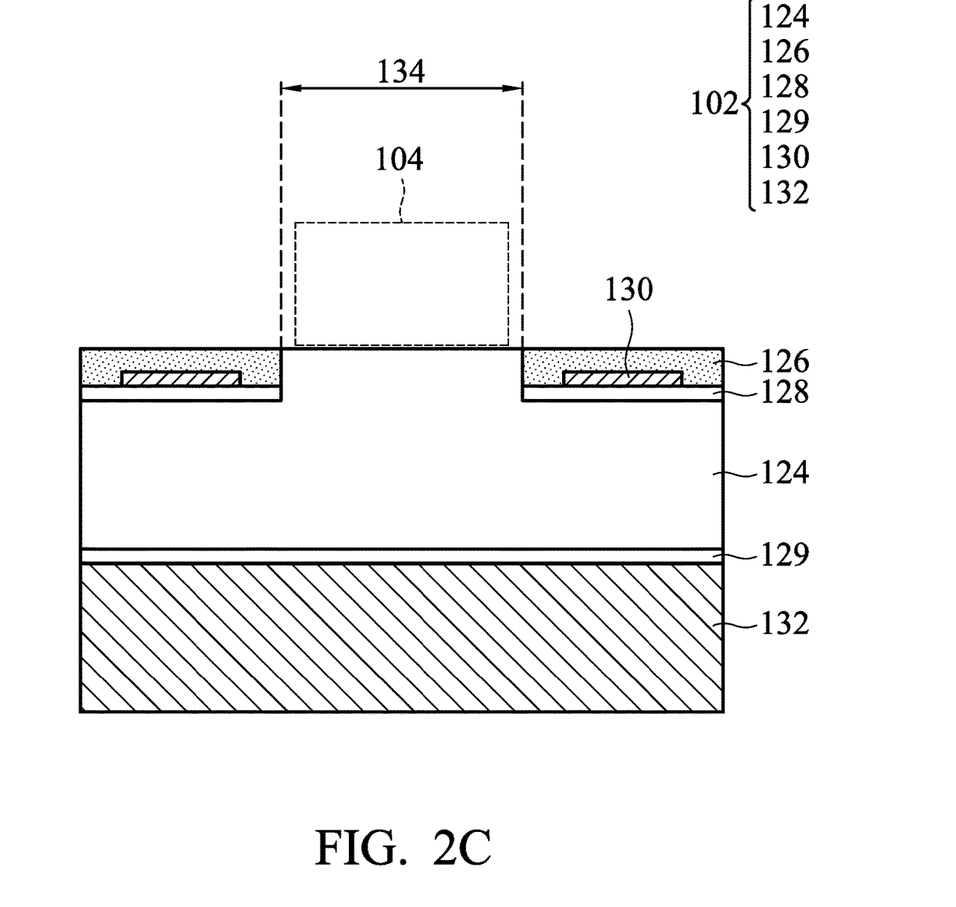
FIG. 2C shows a cross-sectional view of a substrate of an LED chip package according to a further embodiment of the disclosure.

Referring to FIGS. 2A-2C, FIGS. 2A-2C show a cross-sectional view of a substrate of an LED chip package according to other embodiments of the disclosure. As shown in FIG. 2A, the substrate 102 includes a metal layer 124, a passivation layer 126, an adhesive layer 128 and a wire 130. It's should be noted that the fluorescent sheet 114, the reflective element 116, the metal terminal 120 and the electrical connecting area 122 are not shown in FIGS. 2A-2C for clearly illustrating the substrate 102.

The metal layer 124 has a heat sink function, and the material of the metal layer 124 includes metal which has good thermal conductivity, such as copper, aluminum, gold, silver, alloy or another applicable material. The wire 130 is disposed in the substrate 102 for electrically connecting the LED chip set 104 to the metal terminal 120. The material of the wire 130 may be same as the material of the metal layer 124. The wire 130 may be formed by deposition, or by photolithography and etching processes. Examples of deposition processes include chemical vapor deposition (CVD), physical vapor deposition (PVD), plating, and other applicable processes. Examples of etching processes include dry etching and wet etching. The passivation layer 126 is disposed over the metal layer 124 and used for protecting the wire 130 over the metal layer 124. The material of the passivation layer 126 includes polyimide, butyl cyclobutene (BCB), parylene, polynaphthalene, fluorocarbon, acrylate or a combination thereof. The passivation layer 126 may be formed to cover the metal layer 124 by coating or another applicable process. The adhesive layer 128 is used to join the wire 130 and the metal layer 124. The material of the adhesive layer 128 includes polyimide, epoxy resin, ceramic or diamond-like carbon. The thickness of the adhesive layer 128 is in a range between 5 μm and 10 μm. In other embodiments, the formation of the adhesive layer 128 may be omitted.

As shown in FIG. 2A, the LED chip set 104 is disposed on a die bond area 134 of the substrate 102. It's should be noted that, in this embodiment, the metal layer 124 of the substrate 102 includes a convex 124A for increasing the contact surface area between the metal layer 124 and outside environment, and thereby the heat sink ability of the metal layer 124 is improved. In addition, though not shown in FIG. 2A, the LED chip set 104 may be a horizontal chip or a vertical chip.

As shown in FIG. 2B, in some embodiments, the substrate 102 may be a composite substrate. As shown in FIG. 2B, the substrate 102 includes a first portion 102A and a second portion 102B, wherein the die bond area 134 is located at the first portion 102A, and the wire 130 is located at the second portion 102B. In some embodiments, the material of the first portion 102A is inorganic material, such as ceramic, aluminum nitride (AlN), and aluminum oxide (AlO). The material of the 102B is organic material or metal, such as FR4 epoxy oxide glass fiber board, printed circuit board (PCB), copper, aluminum, gold, silver, alloy or another material with a good heat sink ability. In some embodiments, ceramic is selected to be used as the first portion 102A of the substrate 102. Due to the high thermal conductivity, chemical stability, thermal stability and high melting point of ceramic, the substrate 102 of the present disclosure is not degraded after long-term use, and the life of the product is thereby enhanced.

In this embodiment, though not shown in FIG. 2B, the LED chip set 104 may be the horizontal chip or the vertical chip, and the method used for joining the LED chip set 104 and the substrate 102 is flip chip.

Referring to FIG. 2C, in some embodiments, the difference between the embodiments of FIG. 2C and the embodiments of FIG. 2A mentioned above is that the substrate 102 further includes a graphite fiber layer 132. The graphite fiber layer 132 is connected to the metal layer 124 by an adhesion layer 129. Due to the good thermal conductivity of the graphite fiber layer 132 for providing the metal layer 124 with a route for heat dissipation, the LED chip set 104 may avoid overheating after long-term use, and the life of the product is thereby improved. In this embodiment, though not shown, the LED chip set 104 may be a horizontal chip or a vertical chip. In other some embodiments, the metal layer 124 may be replaced by a graphite fiber layer 132 for providing a route for heat dissipation.

In summary, by utilizing the light-emitting diode chip set formed by a plurality of LED chips in one piece (namely the wafer level chip scale packaging LED chip set), the manufacturing step for the light-emitting diode chip package doesn't need to include closely arranging the separated LED chips with high accuracy. Therefore, the cost may be greatly reduced. The fluorescent sheet also does not need to be cut by complicated cutting processes. Therefore, the manufacturing steps of producing an LED chip set may be further simplified and the cost thereof may be reduced. In addition, compared to the conventional multiple LED chips, the light-emitting diode chip set of the present disclosure formed by a plurality of LED chips in one piece breaks the limit beyond the conventional process such that the gap between the light-emitting areas is smaller than 50 μm. Therefore, the LED chip packages of the present disclosure have a more intense emission intensity. Furthermore, the step of disposing a carrier substrate is omitted due to the LED chip set being directly disposed on the substrate having the metal terminal, and the cost of using a carrier substrate is also reduced. In addition, the substrate of the present disclosure may be designed to be a composite substrate or further include a graphite fiber layer for improving the heat sink ability of the substrate, and thereby the product life is improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An LED chip package, comprising:
   a first substrate having a metal terminal; and
   an LED chip set formed by a wafer level chip scale packaging, wherein the LED chip set comprises a second substrate having a plurality of electrically connected LED chips formed in one piece thereon and singulated so as to produce a plurality of light-emitting areas separate from each other, and the LED chip set is disposed on the first substrate and electrically connected to the metal terminal.

2. The LED chip package as claimed in claim 1, wherein the LED chip set comprises a first electrode and a second electrode, and the first electrode and the second electrode are disposed in the same side of the LED chip set.

3. The LED chip package as claimed in claim 2, wherein the first electrode and the second electrode are disposed in the same light-emitting area or in different light-emitting areas of plurality of light-emitting areas.

4. The LED chip package as claimed in claim 1, wherein a gap between the plurality of light-emitting areas is larger than 0 μm and smaller than 50 μm.

5. The LED chip package as claimed in claim 1, further comprising:
   a reflective element disposed at the periphery of the LED chip set.

6. The LED chip package as claimed in claim 1, further comprising:
   a fluorescent sheet disposed over the LED chip set.

7. The LED chip package as claimed in claim 1, wherein the plurality of light-emitting areas are juxtaposed.

8. The LED chip package as claimed in claim 1, wherein the first substrate comprises a metal layer.

9. The LED chip package as claimed in claim 8, wherein the LED chip set is a horizontal chip or a vertical chip.

10. The LED chip package as claimed in claim 8, further comprising:
    a graphite fiber layer disposed below the metal layer.

11. The LED chip package as claimed in claim 1, wherein the first substrate comprises a first portion and a second portion, the material of the first portion comprises inorganic material, and the material of the second portion comprises metal or organic material, the LED chip set is disposed on the first portion, a wire connecting the LED chip set and the metal terminal is disposed in the first portion, and a top surface of the first portion is coplanar with a top surface of the second portion.

12. The LED chip package as claimed in claim 11, wherein the LED chip set is a horizontal chip or a vertical chip.

13. The LED chip package as claimed in claim 11, wherein the LED chip set is bonded with the first substrate by flip chip bonding.

14. The LED chip package as claimed in claim 1, wherein the first substrate comprises a metal layer, the LED chip set is disposed on a convex portion of the metal layer, a wire connecting the LED chip set and the metal terminal is formed adjacent to the convex portion, a passivation layer is formed over the wire, and a top surface of the convex portion is coplanar with a top surface of the passivation layer.

15. The LED chip package as claimed in claim 14, wherein the wire is joined to a portion of the metal layer adjacent to convex portion by an adhesive layer.

* * * * *